United States Patent [19]

Smith

[11] Patent Number: 5,246,316
[45] Date of Patent: Sep. 21, 1993

[54] WORK TABLE ORIENTATION APPARATUS AND METHOD

[75] Inventor: William V. Smith, Tustin, Calif.

[73] Assignee: Excellon Automation, Torrance, Calif.

[21] Appl. No.: 846,858

[22] Filed: Mar. 6, 1992

[51] Int. Cl.$^5$ .................... B23B 35/00; B23B 49/00
[52] U.S. Cl. .................... 408/1 R; 33/638; 33/642; 33/DIG. 2; 364/474.34; 364/474.37; 408/3; 408/13; 409/80; 409/218
[58] Field of Search ............ 408/1 R, 3, 8, 13; 409/80, 186, 193, 207-210, 218-220; 33/638, 642, DIG. 2; 73/4 R; 364/474.34, 474.35, 474.37

[56] References Cited

U.S. PATENT DOCUMENTS 2,846,871 8/1958 Worthen .
2,866,365 12/1958 Worthen .
2,889,631 6/1959 Worrall .

FOREIGN PATENT DOCUMENTS

4-13540 1/1992 Japan ............................ 408/3

Primary Examiner—Steven C. Bishop
Attorney, Agent, or Firm—Knobbe, Martens, Olson & Bear

[57] ABSTRACT

A method of precisely calibrating a spindle position with respect to a drilling apparatus worktable. The drilling apparatus includes a control device, which calculates an expected relative position of the spindle and the worktable based upon predetermined information, and the controlled movement of the spindle relative to the worktable. The method includes positioning the spindle in a first position, empirically determining the position of the spindle with respect to the worktable in both a first and a second direction, and determining a "correction factor" between the expected spindle position relative to the worktable at the first position and the empirically determined spindle position relative to the worktable in the first and second directions. Also, a calibration device, including a body defining an aperture and an opening spaced from the aperture, a first sensor measuring the position of an object in the aperture in a first direction, a second sensor measuring the position of an object in the aperture in a second direction different from the first direction, and a third sensor measuring the direction of an object in the opening in the first direction. The sensors may be differential pressure transducers. The device includes means for securing the device to a worktable to prevent movement of the device in the first and second directions.

25 Claims, 6 Drawing Sheets

WORK TABLE ORIENTATION APPARATUS AND METHOD

FIELD OF THE INVENTION

The present invention relates generally to the orientation of relative distances between elements of machine tools and more specifically to an apparatus and method for orienting a drill spindle and a work table relative to one another.

BACKGROUND OF THE INVENTION

Modern automated manufacturing machines commonly perform hundreds of operations a minute requiring rapid, accurate and repeatable movements. Manufacturing machines typically have a material removal tool, such as a drill bit, which performs multiple operations on a workpiece. The drill bit rotates in a spindle while the workpiece is held on a worktable in a known orientation. The pattern to be machined is predetermined and stored in the memory of a support computer which then controls the relative movements of the spindle and workpiece. In some drilling applications, such as the drilling of holes in printed circuit boards (PCBs), the scale of the operation is reduced to extremely small dimensions.

PCBs are used in practically all types of electronic equipment, radio and television sets, guided missiles, computers, etc. PCB is the designation given to a complete circuit printed onto one or both sides of an insulating board, resulting in a complex yet space-efficient, modular electronic component. In the production of PCBs, numerous holes must be drilled in the insulating board to accommodate the leads of the discrete components secured to the board. Holes are also lined or plated with copper to connect the circuits etched into the copper film of PCB layers in a stack. Furthermore, holes are required to permit the secure mounting of the PCB itself to the inner structure of the host device. As a result, in many cases, literally thousands of holes must be drilled into each of the PCB insulating boards to enable the above-referenced assemblies to be made. The precision machining of these holes is critical in the manufacturing of PCBs.

Another application requiring extreme precision is the use of stacks or layers of PCBs, bonded together to create larger circuits. By necessity, the circuit pattern is etched onto the inner layers prior to any drilling, and thus the holes through the layers must exactly match up with the existing circuit, or the board is useless. Many of the numerous components on complex PCB's are extremely small in size, in order to maximize the efficient use of space, thus providing a dense environment of components. Hole size can be as small as 0.004 inches in the most complex boards. Such hole size requires utmost precision in the placement and drilling of the holes in the PCBs' due to the lower tolerance values associated with the micro-circuitry layout. Normally, the majority of PCB's cost less than $100 as a finished product, but some applications, such as a "mother" board for a supercomputer, might cost up to $15,000. Where PCBs are stacked, it will be appreciated that greater processing charges have been incurred prior to the drilling process. Thus, it becomes even more important to precisely control the drilling operation to avoid drilling errors which would render the board worthless.

For years, efforts have been made to improve the precision of PCB drilling machines. These efforts have generally focused on precisely controlling the movement of the spindle and work table relative to one another. However, particularly with the drilling of stacked PCBs, further breakthroughs are necessary to avoid errors and wasted materials and effort.

SUMMARY OF THE INVENTION

It has been determined that a major factor limiting the precision with which drill holes can be located in the drilling of PCB's is not the ability of the drilling apparatus to control the relative movement of the spindle and the worktable, but that the relative position of the spindle and worktable may vary from the "expected" relative position of the spindle and worktable. That is, due to improper adjustment, loosening of the bolts used to secure the worktable, or jarring, the worktable may shift relative to the spindle. Since this movement is not initiated by the position control mechanism of the drilling apparatus, the control device of the drilling apparatus will not recognize that this change in position has occurred.

Accordingly, the present invention includes a method of precisely calibrating the position of a spindle of a drilling apparatus with respect to a worktable. The drilling apparatus includes the control device, which calculates an expected relative position of the spindle and the worktable based upon predetermined information regarding the relative position of the spindle and the worktable and the controlled movement of the spindle relative to the worktable. The method includes positioning the spindle in a first position with respect to the worktable, empirically determining the position of the first position with respect to the worktable in a first direction, empirically determining the position of the first position with respect to the worktable in a second direction, and comparing the expected relative position of the spindle and the worktable at the first position with the empirically determined relative position of the spindle relative to the worktable in the first direction and the second direction so as to ascertain the "proper correction factor" (i.e., the amount more or less the spindle will need to move relative to the worktable in a given direction to place the spindle in the desired position relative the work table and, thus, a work piece secured thereto). For example, the correction factor in the first direction would be equal to the difference between the expected coordinate of the first position in the first direction and the actual coordinate of the first position in the first direction. The method also includes positioning the spindle in a second position with respect to the worktable, empirically determining the position of the second position with respect to the worktable in a third direction, and comparing the expected relative position of the spindle and the worktable at the second position with the empirically determined relative position of the spindle relative to the worktable in the third direction so as to ascertain the proper correction factor. As will be discussed below, it is unnecessary to measure the position of the second point in two directions. Furthermore, desirably, the first direction and third direction are the same.

Another aspect of the invention is a method of precisely calibrating the position of the spindle of a drilling apparatus with respect to a worktable where the drilling apparatus includes a control device which calculates an expected relative position of the spindle on the worktable based upon predetermined information regarding the relative position of the spindle and the worktable, and the controlled movement of the spindle relative to the worktable. The worktable includes a first positioning clamp to secure a workpiece to the table. A member is inserted into the clamp and the clamp is closed to secure the member against movement in a first direction. A first sensor having a first position indicator is positioned such that the first position indicator indicates the position of the member in the first direction with respect to the sensor. The sensor is then secured against movement in the first direction with respect to the clamped position of the member. The clamp is released sufficiently to permit removal of the member from the clamp, and the member is removed. The spindle is positioned with respect to the first sensor in a calibration position such that the first position indicator indicates that the calibration position of the spindle in the first direction with respect to the first sensor is the same as the clamped position of the member in the first direction. The calibration position of the spindle in the first direction and the expected position of the spindle are compared by the control device so as to ascertain the proper correction factors. Advantageously, the clamped position of the member is sensed from both sides of the member, and the position of the spindle is sensed from both sides of the spindle.

Desirably, the method further includes the steps of positioning a second sensor having a second position indicator such that the second position indicator indicates the position of the member in the second direction with respect to the second sensor, securing the second sensor against movement in the second direction with respect to the clamped position of the member. The second spindle is positioned with respect to the second sensor in a calibration position such that the second position indicator indicates that the calibration position of the spindle in the second direction is the same as the clamped position of the member. The calibration position of the spindle in the second direction is compared with the expected position of the spindle determined by the spindle control device so as to ascertain the proper correction factors. Advantageously, the clamped position of the member is sensed from both sides.

Advantageously, the method also includes the steps of inserting a member into a second clamp and closing the second clamp to secure the member against movement in a third direction. A third sensor having a third position indicator is positioned such that the third position indicator indicates the position of the member in the third direction with respect to the third sensor, and the third sensor is secured against movement in the third direction with respect to the clamped position of the member. The second clamp is released sufficiently to permit removal of the member, and the member is removed from the second clamp. The spindle is positioned with respect to the sensor in a calibration position such that the third position indicator indicates that the calibration position of the spindle in the third direction with respect to the third sensor is the same as the clamped position of the member in the third direction. The calibration position of the spindle in the third direction is compared with the expected position of the spindle, determined by the control device, so as to ascertain the proper correction factors. Desirably, the first direction is the same as the third direction, and the clamped position of the member in the second clamp is sensed from both sides.

Another aspect of the invention is a calibration device, including a body defining an aperture and an opening spaced from the aperture, a first differential pressure transducer measuring the position of an object in the aperture in a first direction, a second differential pressure transducer measuring the position of an object in the aperture in a second direction different from the first direction, and a third differential pressure transducer measuring the direction of an object in the opening in the first direction. Advantageously, the device includes means for securing the device to a worktable to prevent movement of the device in the first direction and the second direction. Preferably, this securing means comprises releasable vacuum cups.

DETAILED DESCRIPTION OF THE INVENTION

Figure 1:
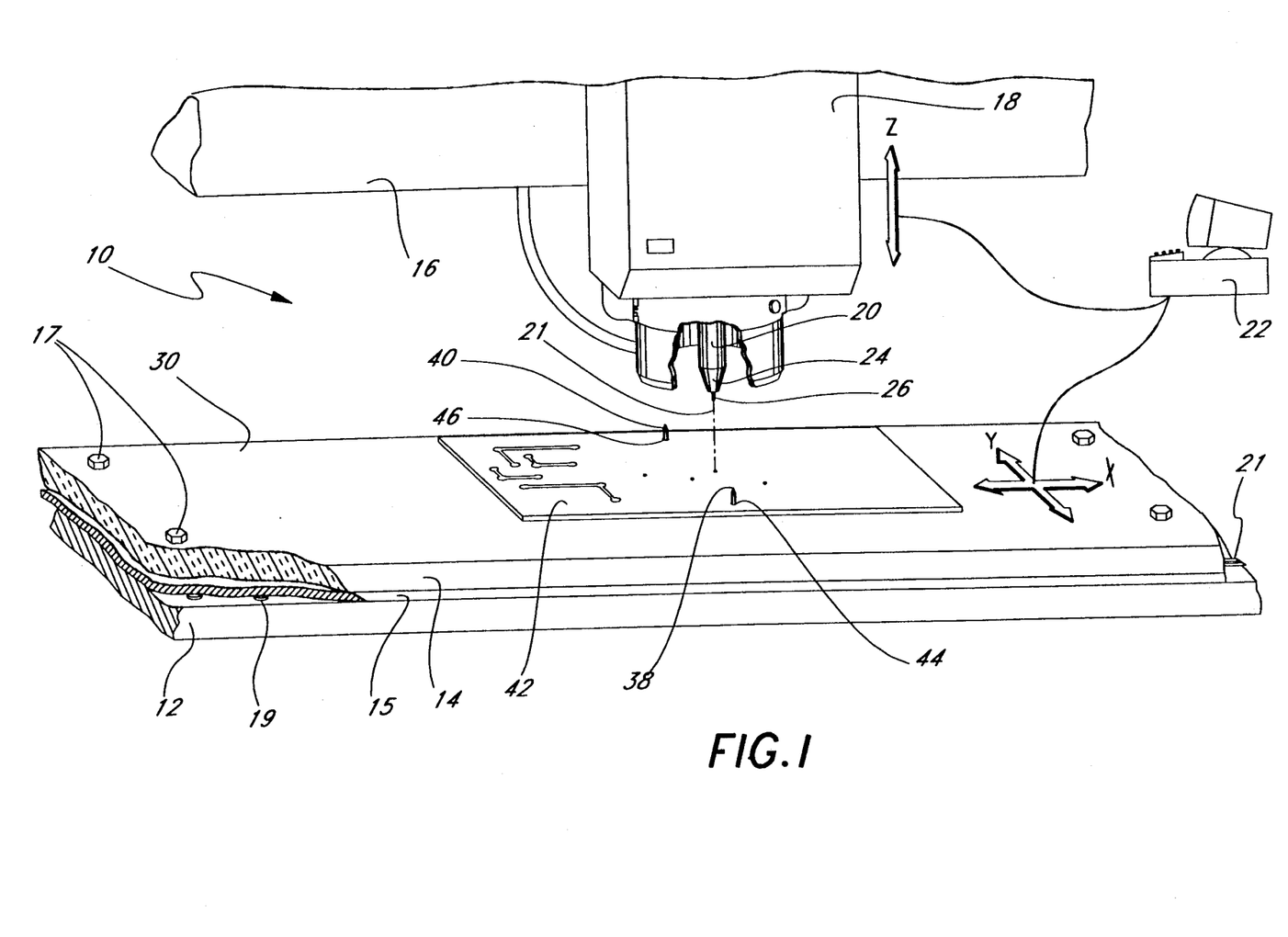
FIG. 1 is a perspective view of a drill press in which the orientation apparatus of the present invention may be used.

Referring to FIG. 1, the environment in which the work table orientation apparatus may be used is shown. A drill press 10 comprises a base 12, a worktable 14, a carriage 15, an upper frame 16, a drill column 18 and a spindle 20. The worktable 14 is rigidly affixed to the carriage 15 with bolts 17. The worktable 14 and carriage 15 ride on air bearings 19 over the base 12 and can be precisely moved along guides 21 in the X-Y plane relative to the base by power lead screw mechanisms (not shown), or other means well known in the art. The spindle 20 is similarly movable in a vertical Z-direction relative to the drill column 18 and worktable 14. The movements of the worktable 14 and the spindle 20 are actuated by instructions sent from a control device 22. The resulting positional changes are recorded by sensors (not shown), such as optical sensors, and the information transmitted to the control device 22 as feedback. Typical control devices are digital controllers for drilling machines, such as Excellon Automation Model CNC-7 sold by Excellon Automation of Torrance, Calif. Such control devices and the software therefor is known in the art, and thus will not be discussed in detail.

A chuck 24 at the end of the spindle 20 firmly aligns and holds various drill bits 26 along a spindle axis of rotation 21. The position of the drill bit 26 relative to any point on the worktable 14 can be adjusted precisely by the control device 22 in three dimensions. This freedom of movement allows the drill press 10 to machine complex patterns at varying depths and with maximum speed. The two-dimensional horizontal movement of the worktable 14 and the vertical movement of the spindle 20 is representative of only one such system to enable relative three-dimensional movement therebetween. The drill column 18 with spindle 20 may also be configured to move horizontally, or the worktable 14 vertically, depending on the particular machine design.

Figure 2:
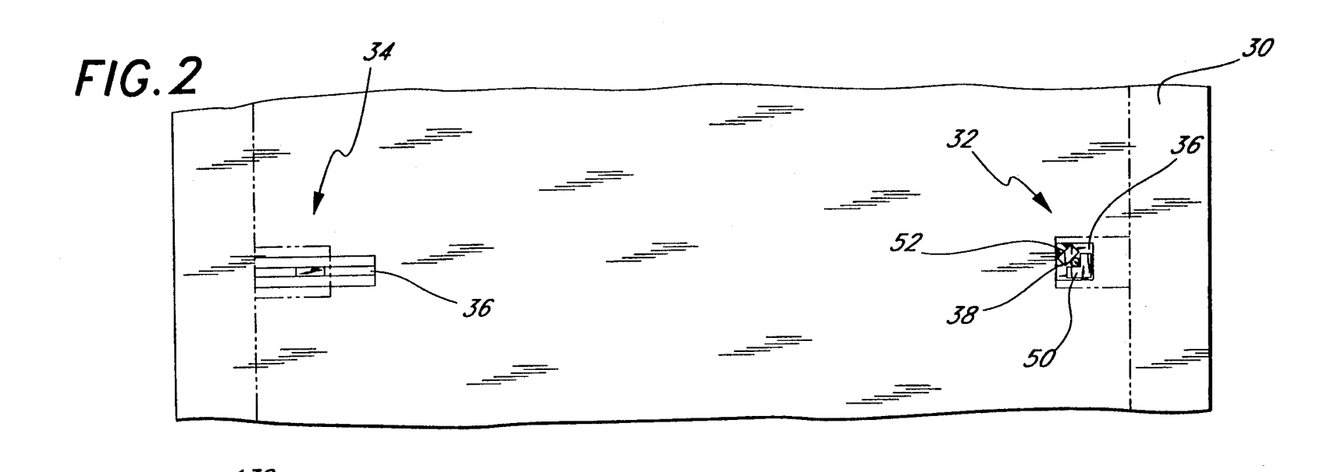
FIG. 2 is a top plan view of the tooling plate of the drill press 1 showing the pin clamps.

Referring now to FIGS. 1 and 2, the top of the worktable 14 comprises a worksurface 30, a point clamp 32 and a line clamp 34. The line clamp 34 and point clamp 32 are recessed into channels 36 to remain below the plane of the worksurface 30. Both clamps 32, 34 are actuated pneumatically by means not shown but well known in the art.

In the ordinary course, location pins 38, 40 are pressed into precisely drilled location holes 44, 46 of a workpiece 42 to be machined. The workpiece 42 is typically a stack of layered materials comprising a backing layer, one or more PCBs, and an entry layer. The pins 38, 40 are held in the clamps on the worktable 14, to position the pins with respect to the spindle axis 21. The pattern to be drilled in the workpiece 42 relative to the location holes 44, 46 is predetermined, and the drill press of is programmed to move the spindle 20 with high precision relative to the worktable 14. Therefore, the exact position of the location pins 38, 40 with respect to the spindle 20 is needed for the control device 22 to know exactly how to manipulate the spindle and worktable 14.

The point clamp 32 comprises a right-angle jaw 50 and a straight jaw 52. The right-angle jaw 50 is fixed while the straight jaw 52 translates along a diagonal line bisecting the right-angle jaw. In an actual drilling operation, the location pins 38, 40 are pressed into the location holes 44, 46 in the workpiece 42 prior to drilling. The first location pin 38 fits into the inside corner of the right-angle jaw 50 and is clamped therein with the straight jaw 52, locating the axis of the first pin, and of the location hole 44, at a fixed point in the X-Y horizontal plane on the worktable 14. The line clamp 34 is so named because it locates the axis of the second location pin 40, and second location hole 46, along a line projected from the axis of the first location pin 38 when fixed in the point clamp 32. The combination of the two clamps 32, 34 orients the workpiece 42 in a precise way on the worktable 14. Looked at another way, the point clamp 32 locates a point on the workpiece 42 in the X-Y plane with respect to the worktable 14, and the line clamp 34 orients the workpiece such that all the remaining points have a known radial and angular relationship from the first point on the worktable.

Initially, the expected clamped locations of the pins 38, 40 relative to the spindle axis 21 are programmed into the control device 22. The precision of available control devices and lead screw mechanisms is such that the workpiece can be machined to exacting tolerances as long as the pins held by the clamps are in the position expected. However, it has been discovered that the actual position of the worktable 14 in the drill press 10 may be altered by exterior forces. For example, the machine bolts 17 or corresponding bolt-holes which fix the worktable 14 to its movement carriage 15 can wear or loosen due to jarring of the worktable. Or incorrectly installing the worktable 14 after performing maintenance on the carriage mechanism 15 can alter its position relative to the spindle 20. As a result, because the actual position of the worktable 14 relative to the spindle 20 is different than the "expected" position, the spindle will drill holes in the wrong location unless the control device 22 is able to calculate a correction factor, or the initial calibration is redone.

As stated above, the control device 22 actuates and tracks all movements of the spindle 20 and worktable 14. With the workpiece 42 correctly oriented on the worktable 14, it is a straight-forward geometric computational task for the control device 22 to control the movement of the spindle 20 and worktable 14 to machine a predetermined pattern in the workpiece. An apparatus and process has been developed to ensure the actual relative position of the workpiece 42 relative to the spindle axis 21 is known by the control device 22. Prior to any use of the drill press 10, the relative geometry of the spindle 20 and worktable 14 is precisely measured and this information stored in the permanent memory of the control device 22. This measurement procedure and memory input is time-consuming and costly, and normally only performed once by the machine manufacturer. Sometimes the worktable 14 must be removed to provide access for maintenance and repair of mechanisms inside the carriage. This can result in discrepancies between its actual and assumed position relative to the spindle axis 21. The precision required by some applications of the drill press 10 renders even these subtle positional discrepancies unacceptable. The system of the present invention provides a relatively quick and simple pre-drilling check of the actual worktable 14 and spindle 20 relationship.

Figure 3:
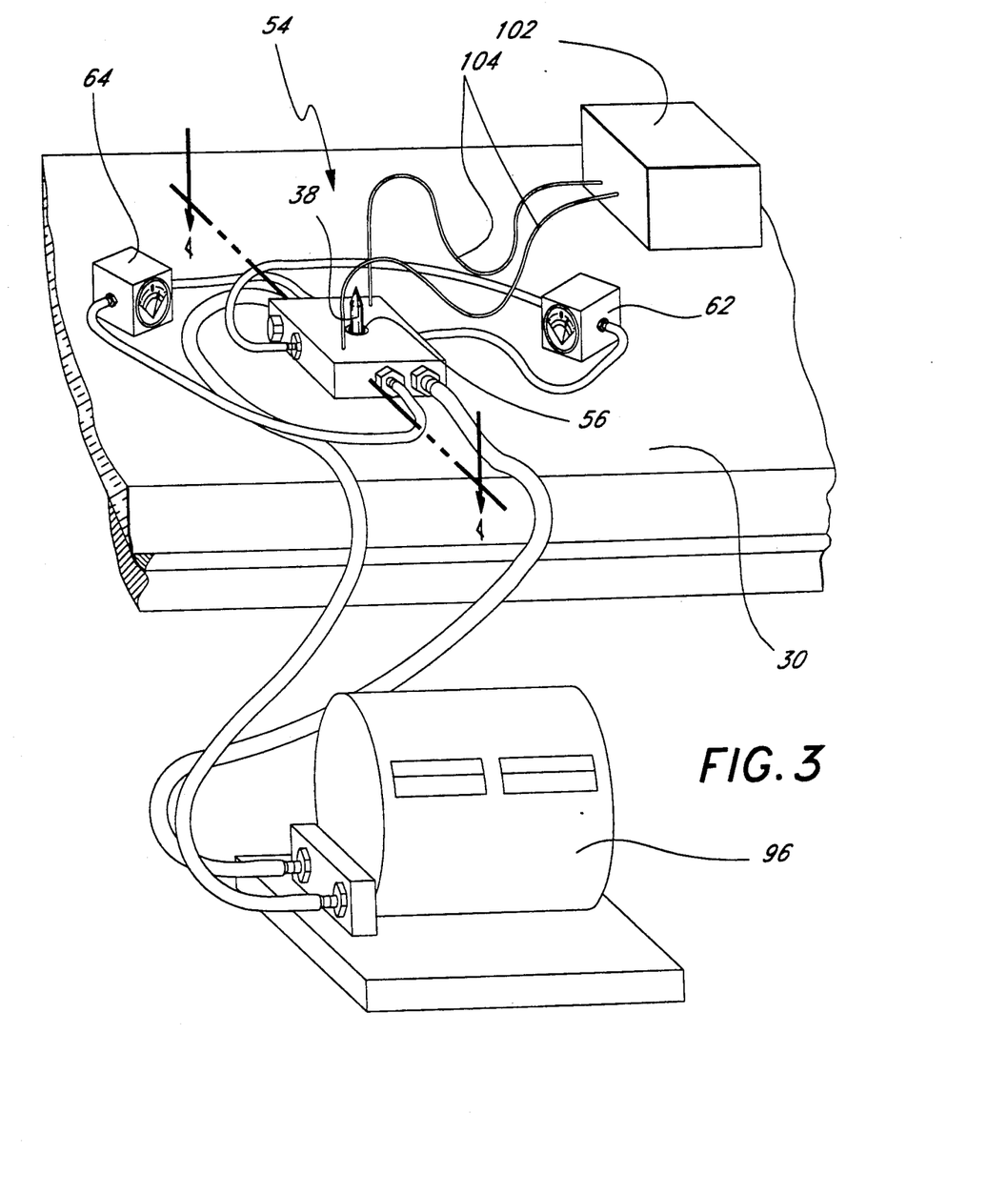
FIG. 3 is an enlarged perspective view of the orientation a of FIG. 1 also showing the associated pneumatic devices.

Referring now to FIG. 3, an orientation apparatus or gauge 54 is shown on the worksurface 30. The gauge defines an aperture 56 for loosely receiving the location pins 38, 40. The gauge 54 also comprises sensors and position indicators to enable the pins 38, 40 to be precisely positioned at the center of the aperture 56. The location pins 38, 40 used during the orientation process preferably have a diameter identical to the pins 38, 40 mounted in the workpieces. However, for reasons which will become clear, the pins 38, 40 used in the orientation process are not secured to a workpiece or any other object.

Figure 4:
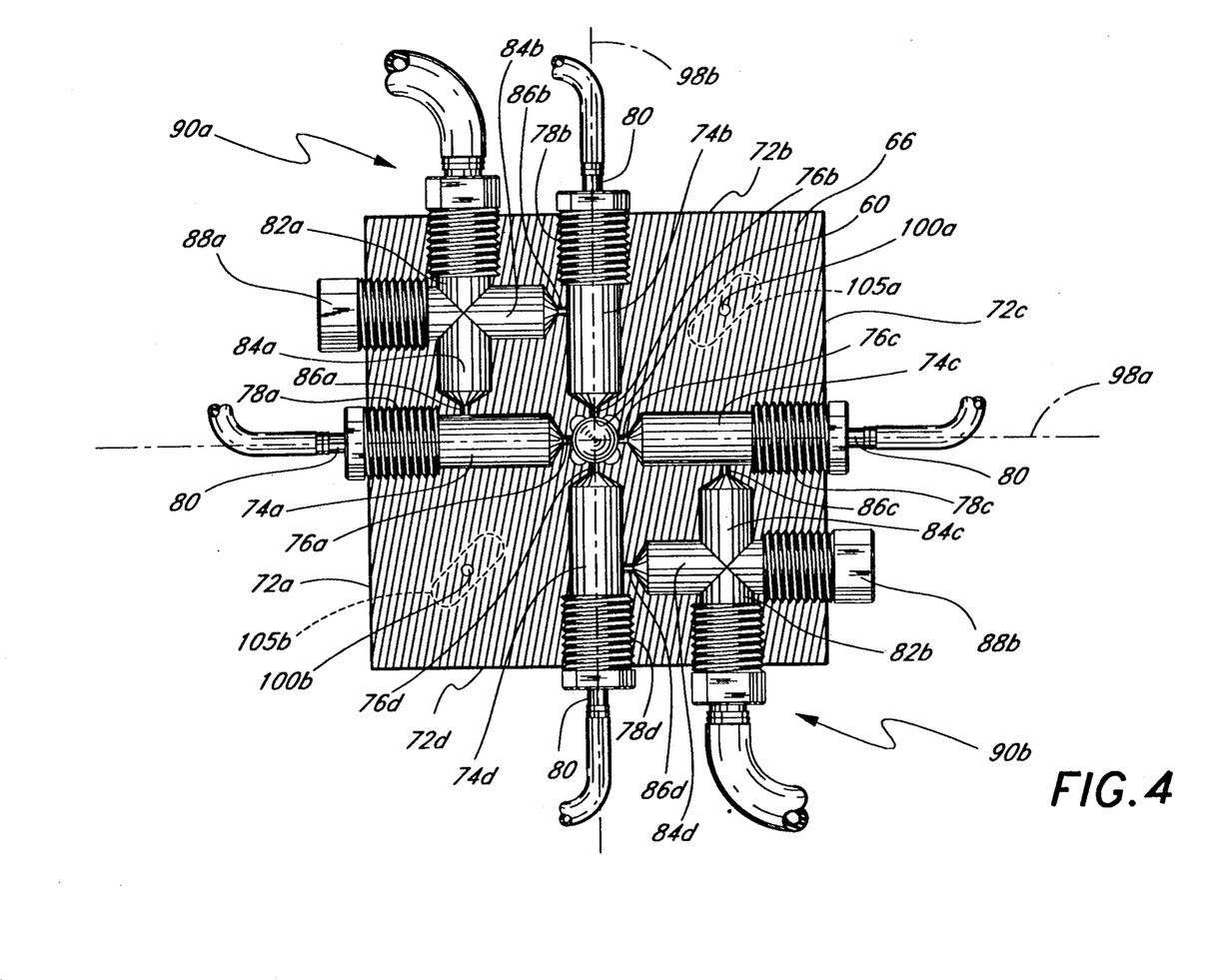
FIG. 4 is a sectional view of the orientation apparatus taken along line 4—4 of FIG. 3.
Figure 5:
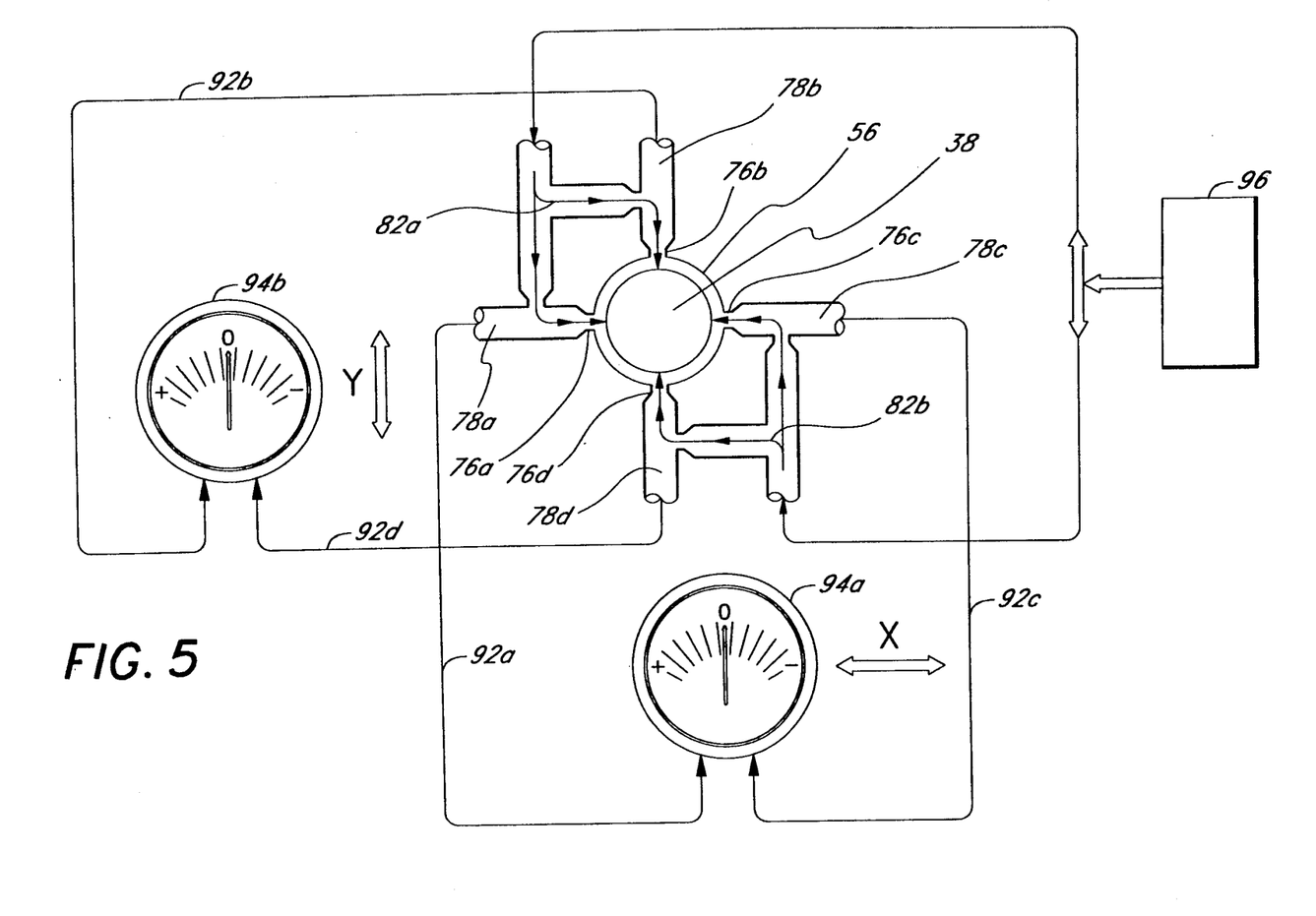
FIG. 5 is a schematic depiction of the flow through the orientation apparatus.

Referring to FIGS. 3, 4 and 5, in the preferred embodiment the orientation gauge 54 is a specially designed proximity air gauge. The proximity air gauge utilizes jets of air against an object with a transducer measuring the pressure upstream of the jet nozzle. The closer the object to the nozzle, the higher the pressure upstream. To center a pin 38 in the preferably cylindrical aperture 56, a measurement along two axes in the horizontal plane is made. The gap between the circular pin 38 and an interior wall 58 defined by the aperture 56 will be uniform at all points when the pin is centered. Preferably, a measurement along intersecting perpendicular axes is taken for increased accuracy.

Another important aspect of the invention is the use of differential pressure measurements from opposite sides of the pin along both axes, thereby increasing the sensitivity of the device. Four jet nozzles 60 are located around the aperture 56 for this purpose. A sensor is located upstream of each jet nozzle 60 to measure the "back" pressure. To simplify the gauge reading even further, the sensors on opposite sides of both axes are simple conduits leading to opposite sides of two 2-input pressure indicators 62, 64. When the two input pressures are equal, the indicators 62, 64 will read zero and point directly upward. The opposing sensors on each axis render the absolute pressure on either side of the pin 38 irrelevant, and instead allow the pin central location to be determined by balancing the two indicator 62, 64 input pressures. This is significant in that it avoids difficulties with maintaining air supply sources at a constant pressure.

Referring to FIGS. 3 and 4, the orientation gauge 54 includes a flat square metal body or plate 66, preferably of aluminum. The aperture 56 passes directly through the center of two flat upper and lower faces of the body 66 of the gauge 54. Beginning at the left side (as shown in FIG. 4), and continuing clockwise, the perimeter of the gauge 54 is defined by, respectively, first, second, third and fourth sides 72a-d. Four measurement channels 74 extend from the center of each of four sides of the gauge 54 to the central aperture 56. Beginning at the first side 72a, and continuing clockwise, there are first, second, third and fourth measurement channels 74a-d comprising cylindrical bores.

Towards the center of the gauge 54, and proximate the aperture wall 58, the channels 74 narrow to approximately one-tenth of the diameter of the greater channel. The narrow end of each channel 74 forms an escape port 76 from the channel opening to a jet nozzle 60 in the aperture wall 58. The gauge 54 thus comprises first, second, third and fourth escape ports 76a-d corresponding to the respective measurement channels 74. Likewise, there are first, second, third and fourth pressure transducer ports 78a-d defined at the end of each respective measurement channel 74 opposite its escape port 76. The pressure transducer ports 78 thus communicate with the aperture 56 via the escape ports 76. The transducer ports 78 preferably have internal threads tapped therein for attaching a pressure transducer (FIG. 3). More preferably, externally threaded male air hose connections 80 (FIG. 3) are attached to each transducer port 78 to allow connection to air hoses, as will be described more fully below.

A first air supply chamber 82a exists between, and communicates with, the first and second measurement channels 74a,b. The first air supply chamber 82a is formed by two preferably perpendicular cylindrical bore holes 84a,b extending inwardly from the second and first sides 72b,a, respectively. The first air supply chamber 82a has a first outlet port 86a at the inner end of the first hole 84a, communicating with the first measurement channel 74a. Similarly, the first air supply chamber 82a has a second outlet port 86b at the inner end of the second hole 84b, communicating with the second measurement channel 74b. Both outlet ports 86 are equal in diameter and somewhat smaller than the diameter of the escape ports 76a-d. A plug 88a is affixed into the outer end of the second bore hole 84b, providing an air-tight barrier. The end of the first bore hole 84a in the second side 72b forms a first air supply chamber inlet port 90a. A conventional externally threaded barbed male air hose nipple (see FIG. 3) is attached to the first air supply chamber inlet port 90a to allow easy connection with an air supply.

The orientation gauge 54 is symmetric across a diagonal line from the corner between the first and fourth sides 72a, 72d to the corner between the second and third sides 72b, 72c. Consequently, a second air supply chamber 82b identical to the first exists in the opposite quadrant of the orientation gauge 54. The second air supply chamber 82b is formed by third and fourth cylindrical bore holes 84c,d extending inwardly from the fourth and third sides 72d,c, respectively. The inner end of the third bore hole 84c communicates with the third measurement channel 74c via a third outlet port 86c, and the inner end of the fourth bore hole 84d communicates with the fourth measurement channel 74d via a fourth outlet port 86d. A plug 88b is inserted in the fourth bore hole 84d to form an air-tight seal. The end of the third bore hole 84c in the fourth side 72d forms a second air supply chamber inlet port 90b. A conventional externally threaded barbed male air hose nipple (see FIG. 3) is attached to the second air supply chamber inlet 90b to allow easy connection with an air supply 96.

Desirably, the orientation gauge 54 is provided with a means of clamping the gauge 54 to the worktable 14. Such means preferably comprises a magnetic holding device to generate electromagnetic attraction between the gauge 54 and worksurface 30. Alternative means such as a vacuum apparatus may also be used. In the preferred embodiment, as seen in FIGS. 3 and 4, two electrical leads 100a,b are symmetrically disposed in the quadrants of the gauge 54 absent of air supply chambers 82. An external electric power source 102 connects to the leads 100a,b through wires 104. Electromagnets 105a,b, fitting in recesses in the bottom face of the gauge 54, communicate with the power source 102 via the leads 100 and wires 104. A sufficient holding force is generated when a preset current is applied to the electromagnets 105a,b to firmly hold the gauge 54 to the worksurface 30. An additional advantage is provided by the ability of the power source 102 to induce a partial holding force upon application of a low current. The partial holding force assists the operator in affecting slight positional adjustments when attempting to align a pin 38, 40 within the aperture 56.

In the schematic of FIG. 5, the flow path of the differential air gauge system is shown. Four independent air hoses 92a-d extend from the transducer ports 78 of the four measurement channels 74a-d, respectively. The first and third air hoses 92a,c connect to two inputs of a first differential pressure indicator 94a, or transducer. The first differential indicator desirably reads zero when its two inlet pressures are balanced. The second and fourth air hoses 92b,d connect to two inputs of a second differential indicator 94b, or transducer. The second differential indicator 94b desirably reads zero when its two inlet pressures are equal.

The common air supply 96 introduces pressurized air to both the first and second air supply chambers 82a,b, thus advantageously assuring equal pressure in the chambers 82a,b. As shown in FIG. 4, air enters the four measurement channels 74 via the respective air outlet ports 86 and flows into the gauge aperture 56 through the four escape ports 76. The region of each measurement channel 74 proximate its transducer port 78 experiences no flow due to the dead end connection with one of the pressure inlets of one of the differential indicators 94a,b. The pressure proximate each transducer port 78 indirectly reflects the flow rate of air through the corresponding escape port 76. In the absence of an object within the aperture 56, the air stream encounters a minimal and equivalent flow resistance through each escape port 76. A higher resistance to flow through the escape port 76 caused by an object in the aperture 56 raises the "back pressure" at the transducer port 78. Sensing of the "back pressures" in the four measurement channels 74 provides the information necessary to center a pin 38 in the aperture 56. If the pressure in the respective chambers 82a,b in the absence of an object in the aperture 56 is not equal, the device should desirably be checked for obstructions. Alternatively, although not recommended, the indicators 94a,b could be set to zero, thus correcting for the obstruction.

The orientation gauge 54 is placed so that a location pin 38 extends through the aperture 56. Desirably, the clearance between the pin 38 and the aperture 56 is chosen to increase the sensitivity of the gauge and to reduce the amount of adjustment needed to exactly center the pin. In one embodiment, the location pins have an outside diameter of 0.125 inches and the aperture 56 has an inside diameter of 0.132 inches. The air supply 96 is turned on, causing air to be forced out the escape ports 76 to encounter the location pin 38 and otherwise disperse. The first differential indicator 94a reflects the pressure differential in the first and third measurement channels 74a,c and accordingly, the position of the location pin 38 along a first direction 98a defined by a line through the first and third measurement channels. The location pin 38 is equidistant from the aperture wall 58 in the first direction 98a if the first indicator 94a reads zero. Similarly, the second differential indicator 94b reflects the position of the location pin 38 along a second direction 98b defined by a line through the second and fourth measurement channels 74b,d. The location pin 38 is equidistant from the aperture wall 58 in the second direction 98b if the second indicator 94b reads zero. Moreover, if both indicators read zero, the location pin 38 is exactly centered in the aperture 56 of the orientation gauge 54.

The procedure for orientating the drill press 10 begins with the insertion of the two location pins 38, 40 into both the point clamp 32 and line clamp 34. The clamps 32, 34 are actuated to hold the pins 38, 40. The orientation gauge 54 is brought down over the first pin 38 and the air supply 96 is turned on. By manually or otherwise manipulating the gauge 54, the pin 38 is centered in the aperture 56 by positioning the gauge so that the first and second direction indicators 94a,b read zero. The power source 102 is actuated to firmly hold the orientation gauge 54 to the worksurface 30. The point clamp 32 is deactivated, and the first pin 38 removed from the aperture 56.

The first pin 38 is then inserted in the chuck 24 of the spindle 20 and tightened therein. The worktable 14 and/or spindle 20 are caused to move the spindle axis 21 over the gauge aperture 56. The spindle 20 is lowered, lowering the first pin 38 within the aperture 56. By manipulation of the relative spindle 20 and worktable 14 horizontal positions, the first pin 38 is centered within the aperture 56 by zeroing the first and second direction indicators 94a,b. Preferably, the spindle 20 is caused to rotate during this step, thus eliminating any errors associated with pin run-out, or misalignment with the spindle axis 21. Any run-out will be averaged by the relatively slow-response time of the indicator 94a,b sensors. If run-out occurs, the average position of the pin 38 will define a conical path within the aperture 56, with its center along the spindle axis 21. At this point, a comparison is made by the control device 22 between the present spindle axis 21 position and the "expected" position of a pin 38 within the point clamp 32.

Following the orientation of the first pin 38 in the point clamp 32, the actual position of the second pin 40 in the line clamp 34 relative to the spindle axis 21 is ascertained. Although the exact Y-position of the second location pin 34 when pressed into a workpiece 42 in a subsequent drilling operation may or may not be located at the same Y-position as in the orientation step, an exact correspondence in the X-direction is all that is necessary. The orientation gauge 54 is brought down over the second pin 40 and the air supply 96 turned on. By manually manipulating the gauge 54, the pin 40 is centered in the aperture 56 along the first direction 98a by positioning the gauge 54 so that the first direction indicator reads zero. The holding means is actuated to firmly hold the orientation gauge 54 to the worksurface 30. The line clamp is deactivated, and the second pin 40 removed from the aperture 56.

The second pin 40 is then inserted in the chuck 24 of the spindle 20 and tightened therein. The worktable 14 and/or spindle 20 are caused to move the spindle axis 21 over the gauge aperture 56. The spindle 20 is lowered, lowering the second pin 40 within the aperture 56. As mentioned above, the spindle 20 is preferably rotated during this step to average the position of the pin 40 and eliminate errors associated with run-out. By manipulation of the relative spindle and worktable horizontal positions, the second pin 40 is centered along the first direction 98a within the aperture 56 by zeroing the first direction indicator 94a. At this point, a comparison is made by the control device 22 between the current spindle axis 21 position and the "expected" position of the second pin 40 within the line clamp 34. The control device 22 is thus aware of the differences between the actual and "expected" positions of both pins, and can adjust its subsequent drilling instructions to the drill press 10.

An alternative use for the gauge 54 is to reset the position of the worktable 14 relative to the spindle 20. The procedure described above for determining a correction factor is followed except that instead of the control device 22 mathematically determining the correction factors, the worktable is itself positioned in the location where the control device expects the worktable to be. The first location pin 38 is secured in the point clamp 32 and the gauge 54 is positioned over the pin 38. Once the gauge 54 is positioned so that the pin 38 is centered, the pin 38 is released from the point clamp 32 and is inserted into the spindle 20. The spindle 20 is then positioned exactly over the location where the control device expects the clamped position of pin in the point clamp 32 to be. Presuming that some discrepancy exists between the actual and expected position of the clamped position of a pin in the point clamp 32, the bolts 17, holding the worktable 14 to the carriage 15, are loosened to allow relative movement therebetween. If necessary, the worktable 14 is moved so that the pin 38 in the spindle 20 is centered over the aperture of the gauge 54. The pin 38 is lowered into the aperture and the position of the worktable 14 is adjusted until the location pin 38 in the spindle 20 is centered in the aperture of the gauge 54. A similar adjustment for the line clamp is made while holding the point clamp 32 in a steady position. In this manner, the point clamp 32 and line clamp 34 are brought back to their original positions relative to the spindle as calibrated and stored in the control device 22, and no correction factor is needed.

Figures 6, 7:
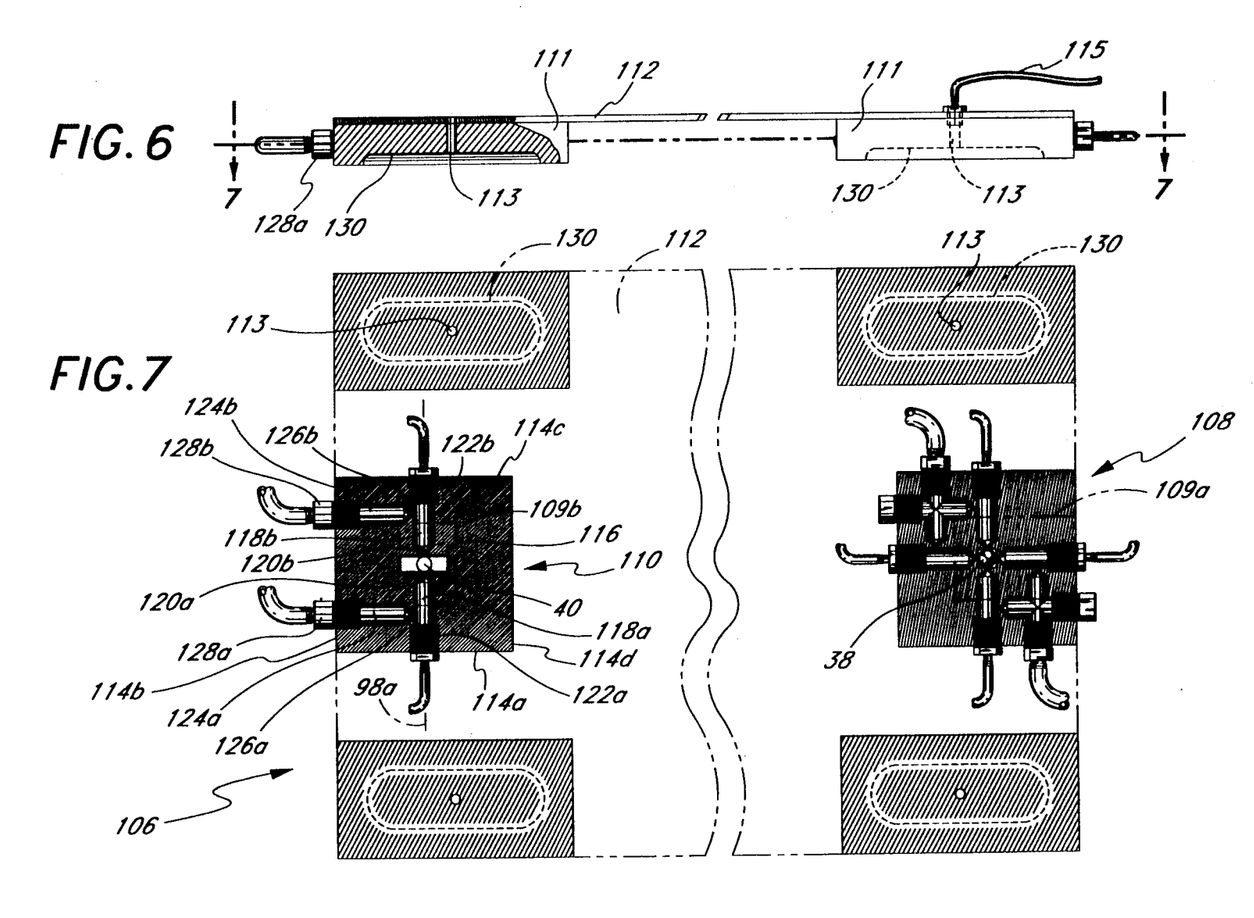
FIG. 6 is a side elevational view of an alternative embodiment of the orientation apparatus of the present invention partially cut-away to show the vacuum feet.
FIG. 7 is a cross-sectional view along line 7—7 of the apparatus of FIG. 6.
Figure 8:
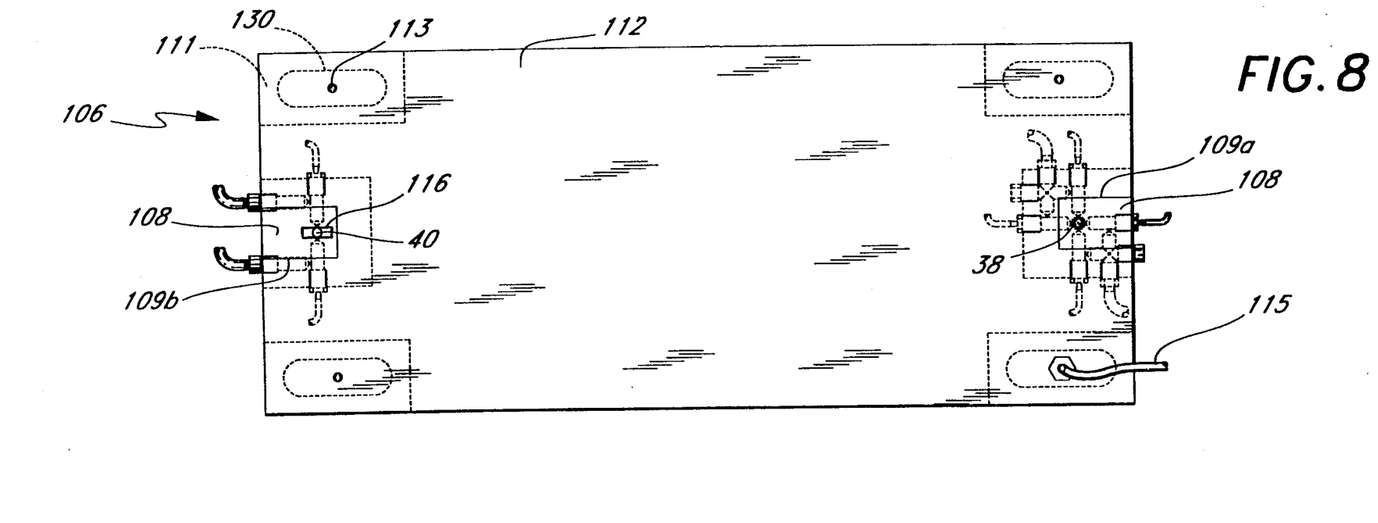
FIG. 8 is a top plan view of the apparatus of FIG. 6.

In a second embodiment as seen in FIGS. 6, 7 and 8, an integrated orientation gauge 106 combines both a two-direction differential air gauge 108 and a single-direction differential air gauge into one apparatus. The gauges 108, 110 mount to the underside of a rectangular plate 112 of sheet metal. Two apertures 109a,b in the plate 112 comprise windows to provide access to the upper faces of the gauges 108, 110. The two-direction differential air gauge 108 centers the first pin 38 at a single point, and the single-direction differential air gauge centers the second location pin 40 along a line, similar to steps performed separately in the preferred embodiment by the orientation gauge 54. This simplifies the orientation operation by requiring only one placement of an orientation apparatus over the worktable 14. The principles applied to the second embodiment are identical to those previously described, and the differential air gauges work substantially the same way as in the preferred embodiment.

As seen in FIGS. 6 and 7, the two-direction differential air gauge 108 depends from one end of the plate 112. The internal structure and mechanism of the two-direction differential air gauge 108 of the second embodiment are substantially the same as the preferred embodiment, and as such it will not be described again. Like parts will be assigned the same numbers as in the preferred embodiment.

At the opposing end of the plate 112, a single-direction differential air gauge 110 depends from the plate. The single-direction differential air gauge 110 comprises first, second, third and fourth sides 114a-d, and an elongated aperture 116 disposed along the longitudinal axis of the plate 112 between the first and third sides 114a,c. The first side 114a comprises a fifth measurement channel 118a with a fifth escape port 120a and a fifth transducer port 122a at opposing ends, the fifth escape port communicating with the central aperture 116. On the opposite side of the plate 112, the third side 114c comprises a sixth measurement channel 118b with a sixth escape port 120b and a sixth transducer port 122b, the sixth escape port communicating approximately one-fourth of their diameters at the escape ports 120a,b.

The second side 114, i proximate the end of the elongated plate 112, comprises a third air supply chamber 124a with a fifth outlet port 126a in the side of the fifth measurement channel 118a providing communication therewith. The second side 114b additionally comprises a fourth air supply chamber 124b with a sixth air outlet port 126b in the side of the sixth measurement channel 118b providing communication therewith. A conventional externally threaded barbed male air hose nipple 128a,b is attached to the exterior end of the both air supply chambers 124a,b.

The single-direction differential air gauge 110 locates an object along a first direction 98a in a similar manner as the two-direction differential air gauge does in two directions 98a,b. That is, a pressure transducer senses the pressure upstream of the outlet ports 126a,b in each measurement channel 118a,b and the two pressures are fed into two inlets of a differential pressure indicator (not shown but identical to the indicators 94a,b) which reads zero when the pressures are balanced.

The preferred holding means of the second embodiment of the orientation gauge 106 is a vacuum apparatus integral with the plate 112. Preferably, four identical vacuum feet 111, comprising rectangular blocks of the same thickness as the gauges 108, 110, mount to the four corners of the underside of the plate 112. The feet 111 are preferably machined aluminum, and the mounting means for the feet to the plate 112 are preferably bolts (not shown), but may also be welds or clamps. Insets 130 within the feet 111 have conduits 113 connecting them with hoses 115 which ultimately extend from an external vacuum generator (not shown). Preferably, the insets 130 comprise oval-shaped recesses, and the conduits 113 enter the recesses at the topmost point. When the orientation gauge 106 is placed on top of the worksurface 30, the flatness of the feet provide excellent sealing properties for a vacuum actuated within the insets 130. Additionally, the vacuum force can be varied so that the gauge 106 can be moved around on the worksurface 30 with a slight vacuum force and then clamped rigidly to the table with a greater force. Such a situation might arise when the movement of the gauge 106 to center it around a location pin is very small and a fine position adjustment is required. Alternative means for holding the gauge 106 to the worksurface 30, such as an electromagnetic force generator, are contemplated, and fall within the scope of this invention.

The procedure for orientating the first pin 38 in the point clamp 32 with the two-direction differential air gauge 108 is identical to that used with the independent air-gauge 54 of the first embodiment, and will not be described again.

After orientation of the first pin 38 within the point clamp 32, the second location pin 40 is inserted and held within the line clamp 34. The single-direction differential air gauge 110 is placed so that the pin 40 is disposed within the elongated aperture 116. The vacuum generator is then partially actuated and the gauge 106 manipulated to center the pin 40 in the aperture 116 along a first direction 98a by zeroing the first-direction indicator. The vacuum generator is then fully actuated to hold the orientation gauge 106 to the worksurface 30. The line clamp 34 is deactivated and the second pin 40 removed from the elongated aperture 116. The pin 40 is inserted into the chuck 24 of the spindle 20, and the spindle axis 21 brought over the elongated aperture 116. The pin 40 is lowered into the aperture 116 and once again centered along a first direction 98a utilizing the first direction indicator. As previously described in connection with the preferred method of orientation, the spindle 20 rotates the pin 40 to average its position around the spindle axis 21, and eliminate errors associated with run-out. The difference between the "expected" position of the second pin 40 in a first direction and the actual position of the pin in the first direction is transmitted to the control device 22. The control device 22 now has precise information about where the first and second pins 38, 40 are located, and thus where the workpiece 42 is located with respect to the worktable 14.

It is understood that other forms of sensors could be used by the orientation gauges 54, 106, such as optical sensors or electromagnetic proximity sensors. Likewise, the indicators may be analog or digital, depending on sensor output and operator preference. However, it is believed that the use of differential pressure gauges provides a reliable, accurate and, compared to the alternative, inexpensive means for determining the precise position of the worktable, and therefore the workpiece, relative to the spindle.

Additionally, the initial tooling to machine the gauges 54, 106 is minimal, the shapes being relatively plain flats and threaded tapered holes. The pneumatic plumbing required is of the standard, off-the-shelf variety.

Further, the simplicity of design, and lack of fragile or moving parts, endows the preferred embodiment with an inherent durability and accompanying reliability. The accuracy of the gauges 54, 106 is dependent on ensuring the integrity of the shape of the apertures 56, 116 and symmetry of the opposing escape ports 76, 120, which is a routine quality control matter at production and thereafter. Dropping the gauges 54, 106 will not affect the nozzle shape and gauge performance, due to the internal construction of the aforementioned critical elements in combination with a rigid exterior.

It should be appreciated from the above description that the present invention efficiently orientates a spindle axis 21 with respect to a worktable 14 in an automated machine. While the above description represents the preferred embodiment, the present invention may be embodied in other specific forms without departing from its spirit or essential characteristics. The described embodiment is to be considered in all respects only illustrative and not restrictive and the scope of the invention is, therefore, indicated by the independent claims rather than by the foregoing description. All changes which come within the meaning and range of equivalency of the claims are to be embraced within their scope.

I claim:

1. A method of precisely calibrating the position of a spindle of a drilling apparatus with respect to a work table, said spindle and said work table forming a portion of a drilling apparatus, said drilling apparatus including a control device which calculates an expected relative position of said spindle and said work table based upon predetermined information regarding the relative position of said spindle and said work table and the controlled movement of said spindle relative to said worktable, said work table including a first positioning clamp to secure a workpiece to said table, comprising the steps of:
   inserting a member into said first clamp;
   closing said first clamp to secure said member against movement in a first direction;
   positioning a first sensor having a first position indicator such that said first position indicator indicates the position of said member in said first direction with respect to said first sensor;
   securing said first sensor against movement in said first direction with respect to the clamped position of said member;
   releasing said first clamp sufficiently to permit removal of said member from said first clamp;
   removing said member from said first clamp;
   positioning said spindle with respect to said first sensor in a calibration position such that said first position indicator indicates that the calibration position of said spindle in said first direction with respect to said first sensor is the same as the clamped position of said member in said first clamp in said first direction; and,
   comparing the calibration position of said spindle in said first direction with the expected position of said spindle determined by said control device so as to ascertain a correction factor.

2. The method of claim 1, further comprising sensing the clamped position of said member in said first clamp from both sides of said member in said first direction and sensing the position of said spindle from both sides in said first direction.

3. The method of claim 1, wherein said closing step also secures said member against movement in a second direction different said first direction, further comprising the steps of:
   positioning a second sensor having a second position indicator such that said second position indicator indicates the position of said member in said second direction with respect to said second sensor;
   securing said second sensor against movement in said second direction with respect to said clamped position of said member in said first clamp;
   positioning said spindle with respect to said second sensor in a calibration position such that said second position indicator indicates that said calibration position of said spindle in said second direction with respect to said second sensor is the same as the clamped position of said member in said first clamp; and,
   comparing the calibration position of said spindle in said second direction with the expected position of said spindle determined by said spindle control device so as to ascertain a proper correction factor.

4. The method of claim 3, wherein said first direction and said second direction are orthogonal.

5. The method of claim 4, further comprising sensing the clamped position of said member in said first clamp from both sides of said member in said second direction and sensing the position of said spindle from both sides in said second direction.

6. The method of claim 3, wherein said work table includes a second positioning clamp to secure a workpiece to said table, further comprising:
   inserting a member into said second clamp;
   closing said second clamp to secure said member against movement in a third direction;
   positioning a third sensor having a third position indicator such that said third position indicator indicates the position of said member in said third direction with respect to said third sensor;
   securing said third sensor against movement in said third direction with respect to the clamped position of said member in said second clamp;
   releasing said second clamp sufficiently to permit removal of said member from said second clamp;
   removing said member from said second clamp;
   positioning said spindle with respect to said third sensor in a calibration position such that said third position indicator indicates that the calibration position of said spindle in said third direction with respect to said third sensor is the same as the clamped position of said member in said second clamp in said third direction; and,
   comparing the calibration position of said spindle in said third direction with the expected position of said spindle determined by said control device so as to ascertain a correction factor.

7. The method of claim 6, wherein said first direction is the same as said third direction.

8. The method of claim 6, further comprising sensing the clamped position of said member in said second clamp from both sides of said member in said third direction and sensing the position of said spindle from both sides in said third direction.

9. A method of precisely calibrating the position of a spindle with respect to a work table, said spindle and said work table forming a portion of a drilling apparatus, said drilling apparatus including a control device which calculates an expected relative position of said spindle and said work table based upon predetermined information regarding the relative position of said spindle and said work table and the controlled movement of said spindle relative to said worktable, comprising the steps of:
   positioning said spindle in a first position with respect to said work table;

empirically determining the position of said first position with respect to said work table in a first direction;

empirically determining the position of said first position with respect to said work table in a second direction;

comparing said expected relative position of said spindle and said work table at said first position with the empirically determined relative position of said spindle relative said work table in said first direction and said second direction so as to ascertain a correction factor;

positioning said spindle in a second position with respect to said work table;

empirically determining the position of said second position with respect to said work table in a third direction; and, comparing said expected relative position of said spindle and said work table at said second position with the empirically determined relative position of said spindle relative to said work table in said third direction so as to ascertain a correction factor.

10. The method of claim 9, wherein said first direction and said third direction are the same.

11. The method of claim 9, wherein said work table includes a first positioning clamp and a second positioning clamp to secure a workpiece to said table, and said positioning said spindle in said first position comprises positioning said spindle in a location corresponding to a portion of a workpiece secured in said first positioning clamp and said positioning said spindle in said second position comprises positioning said spindle in a location corresponding to a portion of a workpiece secured in said second positioning clamp.

12. A method of precisely calibrating the position of a spindle of a drilling apparatus with respect to a work table, said spindle and said work table forming a portion of a drilling apparatus, said drilling apparatus including a control device which calculates an expected relative position of said spindle and said work table based upon predetermined information regarding the relative position of said spindle and said work table and the controlled movement of said spindle relative to said worktable, said work table including a first positioning clamp to secure a workpiece to said table, comprising the steps of:

inserting a member into said first clamp;

closing said first clamp to secure said member against movement in a first direction;

positioning a first sensor having a first position indicator such that said first position indicator indicates the position of said member in said first direction with respect to said first sensor;

securing said first sensor against movement in said first direction with respect to the clamped position of said member;

releasing said first clamp sufficiently to permit removal of said member from said first clamp;

removing said member from said first clamp;

positioning said spindle in said first direction in a calibration position which is the expected position of said clamped position of said member in said first clamp in said first direction as determined by said control device; and, positioning said work table in said first direction such that said first position indicator indicates that the calibration position of said spindle in said first direction is the same as said clamped position of said member in said first clamp in said first direction.

13. The method of claim 12, further comprising sensing the clamped position of said member in said first clamp from both sides of said member in said first direction and sensing the position of said spindle from both sides in said first direction.

14. The method of claim 12, wherein said closing step also secures said member against movement in a second direction different said first direction, further comprising the steps of:

positioning a second sensor having a second position indicator such that said second position indicator indicates the position of said member in said second direction with respect to said second sensor;

securing said second sensor against movement in said second direction with respect to said clamped position of said member in said first clamp;

positioning said spindle with respect to said second sensor in a calibration position which is the expected position of said clamped position of said member in said second direction as determined by said control device;

positioning said work table in said second direction such that said second position indicator indicates that the calibration position of said spindle in said second direction is the same as said clamped position of said member in said first clamp in said second direction.

15. The method of claim 14, wherein said first direction and said second direction are orthogonal.

16. The method of claim 15, further comprising sensing the clamped position of said member in said first clamp from both sides of said member in said second direction and sensing the position of said spindle from both sides in said second direction.

17. The method of claim 14, wherein said work table includes a second positioning clamp to secure a workpiece to said table, further comprising:

inserting a member into said second clamp;

closing said second clamp to secure said member against movement in a third direction;

positioning a third sensor having a third position indicator such that said third position indicator indicates the position of said member in said third direction with respect to said third sensor;

securing said third sensor against movement in said third direction with respect to the clamped position of said member in said second clamp;

releasing said second clamp sufficiently to permit removal of said member from said second clamp;

removing said member from said second clamp;

positioning said spindle with respect to said third sensor in a second calibration position which is the expected position of said clamped position of said member in said second clamp in said third direction as determined by said control device; and, positioning said work table in said first direction such that said first position indicator indicates that the second calibration position of said spindle in said first direction is the same as said clamped position of said member in said second clamp in said third direction.

18. The method of claim 17, wherein said first direction is the same as said third direction.

19. The method of claim 18, further comprising sensing the clamped position of said member in said second clamp from both sides of said member in said third direction and sensing the position of said spindle from both sides in said third direction.

20. A calibration device, comprising:
   a body defining an aperture and an opening spaced from said aperture;
   a first differential pressure transducer measuring the position of an object in said aperture in a first direction;
   a second differential pressure transducer measuring the position of an object in said aperture in a second direction different than said first direction; and,
   a third differential pressure transducer measuring the position of an object in said opening in said first direction.

21. The calibration device of claim 20, further comprising means for securing said device to a work table to prevent movement of said device in said first direction and said second direction.

22. The calibration device of claim 21, wherein said securing means comprises releasable vacuum cups.

23. A drilling machine, comprising:
   a spindle movable at least in a vertical direction, a drill tool removably mounted in said spindle, said spindle being adapted to cause rotation of said drill tool to effect drilling, said work table including a first positioning clamp and a second positioning clamp to secure a workpiece to said table;
   a worktable positioned beneath said spindle, said worktable adapted to have a workpiece mounted thereon, said worktable being movable in at least one direction in a horizontal plane so as to position said workpiece at desired locations beneath said spindle;
   a control device which controls operation of said drilling machine, said control device calculating an expected relative position of said spindle and said worktable based upon predetermined information regarding the relative position of said spindle and said worktable; and,
   a calibration device adapted to be secured to said work table over said first positioning clamp, comprising:
   a body defining an aperture and an opening spaced from said aperture;
   a first differential pressure transducer measuring the position of an object in said aperture in a first direction;
   a second differential pressure transducer measuring the position of an object in said aperture in a second direction different than said first direction; and,
   a third differential pressure transducer measuring the position of an object in said opening in said first direction.

24. A calibration device, comprising:
   a body defining:
      an aperture;
      a first air supply chamber having an inlet port for communicating with a source of pressurized air and a first outlet port and a second outlet port;
      a first measurement channel communicating with said first air supply chamber outlet, said first port having a pressure transducer port and a escape port communicating with said aperture;
      a second measurement channel communicating with said first air supply chamber second outlet port having a pressure transducer port and a escape jet communicating with said aperture;
      a second air supply chamber having an inlet port for communicating with a source of pressurized air and a first outlet port and a second outlet port;
      a third measurement channel communicating with said second air supply chamber first outlet port having a pressure transducer port and a escape jet communicating with said aperture; and,
      a fourth measurement channel communicating with said second air supply chamber second outlet port having a pressure transducer port and a escape jet communicating with said aperture;
   a first pressure transducer communicating with said first measurement channel and said third measurement channel;
   a first position indicator capable of indicating whether the pressure in said first and third measurement channels are equal;
   a second pressure transducer communicating with said second measurement channel and said fourth measurement channel; and,
   a second position indicator capable of indicating whether the pressure in said second and fourth measurement channels are equal.

25. A drilling machine, comprising:
   a spindle movable at least in a vertical direction, a drill tool removably mounted in said spindle, said spindle being adapted to cause rotation of said drill tool to effect drilling, said work table including a first positioning clamp and a second positioning clamp to secure a workpiece to said table;
   a worktable positioned beneath said spindle, said worktable adapted to have a workpiece mounted thereon, said worktable being movable in at least one direction in a horizontal plane so as to position said workpiece at desired locations beneath said spindle;
   a control device which controls operation said drilling machine, said control device calculating an expected relative position of said spindle and said worktable based upon predetermined information regarding the relative position of said spindle and said worktable; and,
   a calibration device adapted to be secured to said work table over said first positioning clamp, comprising:
   a body defining:
      an aperture;
      a first air supply chamber having an inlet port for communicating with a source of pressurized air and a first outlet port and a second outlet port;
      a first measurement channel communicating with said first air supply chamber outlet, said first port having a pressure transducer port and a escape port communicating with said aperture;
      a second measurement channel communicating with said first air supply chamber second outlet port having a pressure transducer port and a escape jet communicating with said aperture;
      a second air supply chamber having an inlet port for communicating with a source of pressurized air and a first outlet port and a second outlet port;
      a third measurement channel communicating with said second air supply chamber first outlet port having a pressure transducer port and a escape jet communicating with said aperture; and, a fourth measurement channel communicating with said second air supply chamber second outlet port having a pressure transducer port and a escape jet communicating with said aperture;

a first pressure transducer communicating with said first measurement channel and said third measurement channel;

a first position indicator capable of indicating whether the pressure in said first and third measurement channels are equal;

a second pressure transducer communicating with said second measurement channel and said fourth measurement channel; and, a second position indicator capable of indicating whether the pressure in said second and fourth measurement channels are equal.

* * * * *